(12) United States Patent
Hsu

(10) Patent No.: US 11,374,070 B2
(45) Date of Patent: Jun. 28, 2022

(54) ORGANIC LIGHT EMITTING DIODE DISPLAY PANEL AND APPARATUS HAVING A CONNECTING ELECTRODE IN AN ELECTRODE CONNECTING REGION

(71) Applicants: BOE Technology Group Co., Ltd., Beijing (CN); Hefei Xinsheng Optoelectronics Technology Co., Ltd., Anhui (CN)

(72) Inventor: Minghung Hsu, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 919 days.

(21) Appl. No.: 16/086,732

(22) PCT Filed: Mar. 12, 2018

(86) PCT No.: PCT/CN2018/078710
§ 371 (c)(1),
(2) Date: Sep. 20, 2018

(87) PCT Pub. No.: WO2018/205734
PCT Pub. Date: Nov. 15, 2018

(65) Prior Publication Data
US 2021/0217829 A1 Jul. 15, 2021

Related U.S. Application Data

(63) Continuation-in-part of application No. 15/843,944, filed on Dec. 15, 2017.

(30) Foreign Application Priority Data

May 12, 2017 (CN) .......................... 201710336006.X

(51) Int. Cl.
*H01L 27/32* (2006.01)
*H01L 51/56* (2006.01)
*H01L 51/52* (2006.01)

(52) U.S. Cl.
CPC ...... *H01L 27/3246* (2013.01); *H01L 27/3248* (2013.01); *H01L 27/3262* (2013.01);
(Continued)

(58) Field of Classification Search
CPC . H01L 27/3246; H01L 27/3248; H01L 51/56; H01L 27/3262; H01L 51/5218;
(Continued)

(56) References Cited

U.S. PATENT DOCUMENTS

2005/0112341 A1 5/2005 Ito et al.
2005/0236629 A1 10/2005 Lee et al.
(Continued)

FOREIGN PATENT DOCUMENTS

CN 1979840 A 6/2007
CN 100448329 C 12/2008
(Continued)

OTHER PUBLICATIONS

English translation of JP2012059587, Tamaki. (Year: 2012).*
(Continued)

*Primary Examiner* — Xia L Cross
(74) *Attorney, Agent, or Firm* — Intellectual Valley Law, P.C.

(57) ABSTRACT

An organic light emitting diode display panel includes a pixel definition layer on a base substrate for defining a pixel having at least a first subpixel, a second subpixel, and a third subpixel; a first electrode in the first subpixel and the second subpixel; a first organic light emitting layer for emitting light of a first color in the first subpixel; a second organic light emitting layer for emitting light of a second color in the
(Continued)

second subpixel; a second electrode on a side of the first organic light emitting layer and the second organic light emitting layer distal to the first electrode; a third organic light emitting layer for emitting light of a third color on a side of the second electrode distal to the base substrate; and a third electrode on a side of the third organic light emitting layer distal to the base substrate.

19 Claims, 8 Drawing Sheets

(52) U.S. Cl.
CPC .......... *H01L 51/56* (2013.01); *H01L 51/5218* (2013.01); *H01L 2227/323* (2013.01); *H01L 2251/301* (2013.01); *H01L 2251/303* (2013.01); *H01L 2251/5315* (2013.01); *H01L 2251/558* (2013.01)

(58) Field of Classification Search
CPC ......... H01L 2227/323; H01L 2251/301; H01L 2251/303; H01L 2251/5315; H01L 2251/558
USPC .......................................................... 257/40
See application file for complete search history.

(56) References Cited

U.S. PATENT DOCUMENTS

| | | | |
|---|---|---|---|
| 2007/0170859 A1 | 7/2007 | Choi | |
| 2008/0024060 A1 | 1/2008 | Jonnalagadda et al. | |
| 2009/0128023 A1 | 5/2009 | Kwak et al. | |
| 2010/0231543 A1 | 9/2010 | Momose | |
| 2011/0121753 A1* | 5/2011 | Nagayama | H01L 27/3209 315/294 |
| 2011/0250713 A1 | 10/2011 | Kawasaki | |
| 2012/0069064 A1 | 3/2012 | Yamakita | |
| 2013/0134360 A1 | 5/2013 | Nakanotani et al. | |
| 2013/0168653 A1 | 7/2013 | Nam et al. | |
| 2014/0159074 A1 | 6/2014 | Isobe | |
| 2014/0183502 A1 | 7/2014 | Song et al. | |
| 2014/0197396 A1* | 7/2014 | Madigan | H01L 27/3246 257/40 |
| 2014/0284565 A1* | 9/2014 | Park | H01L 51/0013 257/40 |
| 2015/0243676 A1 | 8/2015 | Jung et al. | |
| 2016/0111478 A1 | 4/2016 | Hong et al. | |
| 2016/0268351 A1 | 9/2016 | Wu | |
| 2016/0358979 A1 | 12/2016 | Wu et al. | |
| 2016/0359142 A1 | 12/2016 | Huangfu et al. | |
| 2017/0053976 A1 | 2/2017 | Oh et al. | |
| 2017/0352718 A1 | 12/2017 | Kim et al. | |

FOREIGN PATENT DOCUMENTS

| | | | | |
|---|---|---|---|---|
| CN | 101436608 | A | 5/2009 | |
| CN | 101496087 | A | 7/2009 | |
| CN | 103137903 | A | 6/2013 | |
| CN | 103187539 | A | 7/2013 | |
| CN | 103441136 | A | 12/2013 | |
| CN | 103824875 | A | 5/2014 | |
| CN | 103915482 | A | 7/2014 | |
| CN | 104681736 | A | 6/2015 | |
| CN | 104733501 | A | 6/2015 | |
| CN | 105914223 | A | 8/2016 | |
| CN | 107170900 | A | 9/2017 | |
| JP | 2007200887 | A | 8/2007 | |
| JP | 2012059587 | * | 3/2012 | ............. H01L 51/50 |
| JP | 2012059587 | A | 3/2012 | |
| JP | 2012199207 | A | 10/2012 | |
| JP | 2016018691 | A | 2/2016 | |
| WO | 2012070586 | A1 | 5/2012 | |

OTHER PUBLICATIONS

Second Office Action in the Chinese Patent Application No. 201710336006.X, dated Mar. 7, 2019; English translation attached.
First Office Action in the Chinese Patent Application No. 201880000157.0, dated Dec. 26, 2019; English translation attached.
The Extended European Search Report in the European Patent Application No. 18782630.0, dated Dec. 5, 2019.
International Search Report & Written Opinion dated Jun. 11, 2018, regarding PCT/CN2018/078710.
First Office Action in the Chinese Patent Application No. 201710336006.X, dated May 3, 2018; English translation attached.
Non-Final Rejection in the U.S. Appl. No. 15/843,944, dated May 18, 2018.
Response to Non-Final Rejection in the U.S. Appl. No. 15/843,944, dated Aug. 20, 2018.
Non-Final Rejection in the U.S. Appl. No. 15/843,944, dated Dec. 5, 2018.
Response to Non-Final Rejection in the U.S. Appl. No. 15/843,944, dated Mar. 5, 2019.
First Office Action in the Japanese Patent Application No. 2019503539, dated Aug. 3, 2021; English translation attached.
First Office Action in the European Patent Application No. 18782630.0, dated Feb. 15, 2022.

* cited by examiner

ORGANIC LIGHT EMITTING DIODE DISPLAY PANEL AND APPARATUS HAVING A CONNECTING ELECTRODE IN AN ELECTRODE CONNECTING REGION

CROSS-REFERENCE TO RELATED APPLICATION

This application is a national stage application under 35 U.S.C. § 371 of International Application No. PCT/CN2018/078710, filed Mar. 12, 2018, which is a continuation-in-part of U.S. patent application Ser. No. 15/843,944, filed Dec. 15, 2017, which claims priority to Chinese Patent Application No. 201710336006.X, filed May 12, 2017. Each of the foregoing applications is herein incorporated by reference in its entirety for all purposes.

TECHNICAL FIELD

The present invention relates to display technology, more particularly, to an organic light emitting diode display panel, an organic light emitting diode display apparatus, a method of driving an organic light emitting diode display panel, and a method of fabricating an organic light emitting diode display panel.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD.

SUMMARY

In one aspect, the present invention provides an organic light emitting diode display panel, comprising a base substrate; a pixel definition layer on the base substrate for defining a pixel comprising at least a first subpixel, a second subpixel, and a third subpixel; a first electrode on the base substrate and in the first subpixel and the second subpixel; a first organic light emitting layer for emitting light of a first color in the first subpixel, the first organic light emitting layer on a side of the first electrode distal to the base substrate; a second organic light emitting layer for emitting light of a second color in the second subpixel, the second organic light emitting layer on a side of the first electrode distal to the base substrate; a second electrode on a side of the first organic light emitting layer and the second organic light emitting layer distal to the first electrode, the first electrode and the second electrode configured to drive light emission of the first organic light emitting layer in the first subpixel and light emission of the second organic light emitting layer in the second subpixel; a third organic light emitting layer for emitting light of a third color on a side of the second electrode distal to the base substrate; and a third electrode on a side of the third organic light emitting layer distal to the base substrate, the second electrode and the third electrode configured to drive light emission of the third organic light emitting layer.

Optionally, an orthographic projection of the third subpixel on the base substrate at least partially overlaps with an orthographic projection of the first subpixel on the base substrate and at least partially overlaps with an orthographic projection of the second subpixel on the base substrate; and the orthographic projection of the first subpixel on the base substrate and the orthographic projection of the second subpixel on the base substrate are substantially non-overlapping with each other.

Optionally, an orthographic projection of the second electrode on the base substrate at least partially overlaps with an orthographic projection of the first electrode on the base substrate.

Optionally, the orthographic projection of the second electrode on the base substrate substantially covers the orthographic projection of the first electrode on the base substrate.

Optionally, an orthographic projection of the third organic light emitting layer on the base substrate at least partially overlaps with an orthographic projection of the first organic light emitting layer on the base substrate and at least partially overlaps with an orthographic projection of the second organic light emitting layer on the base substrate; and the orthographic projection of the first organic light emitting layer on the base substrate and the orthographic projection of the second organic light emitting layer on the base substrate are substantially non-overlapping with each other.

Optionally, the orthographic projection of the third organic light emitting layer on the base substrate substantially covers the orthographic projection of the first organic light emitting layer on the base substrate and the orthographic projection of the second organic light emitting layer on the base substrate.

Optionally, the second electrode comprises a plurality of second electrode blocks respectively in a plurality of pixels; the plurality of second electrode blocks in adjacent pixels of the plurality of pixels are insulated from each other.

Optionally, the pixel definition layer comprises a first sub-layer in regions between adjacent pixels and absent in regions between adjacent subpixels in a same pixel; the first sub-layer has a first side and a second side substantially opposite to each other and a third side connecting the first side and the second side, the first side on a side of the second side distal to the base substrate; the third side of the first sub-layer has a first slope angle with respect to the second side of the first sub-layer greater than approximately 60 degrees; and the plurality of second electrode blocks in adjacent pixels of the plurality of pixels are insulated from each other by the first sub-layer.

Optionally, the first sub-layer has a thickness in a range of approximately 20 nm to approximately 500 nm.

Optionally, the pixel definition layer further comprises a second sub-layer in regions between adjacent subpixels; the second sub-layer is on a side of the first sub-layer proximal to the base substrate; the second sub-layer has a fourth side and a fifth side substantially opposite to each other and a sixth side connecting the fourth side and the fifth side, the fourth side on a side of the fifth side distal to the base substrate; the sixth side of the second sub-layer has a second slope angle with respect to the fifth side of the second sub-layer; and the second slope angle is smaller than the first slope angle.

Optionally, the second slope angle is in a range of approximately 20 degrees to approximately 40 degrees.

Optionally, the organic light emitting diode display panel further comprises a pixel driving circuit; wherein the pixel has an electrode connecting region defined by the pixel definition layer; and the second electrode is electrically connected to the pixel driving circuit through the electrode connecting region.

Optionally, the organic light emitting diode display panel further comprises a fourth electrode in the electrode connecting region; wherein the fourth electrode electrically connects the second electrode to the pixel driving circuit; and an orthographic projection of the second electrode on the base substrate substantially covers an orthographic projection of the fourth electrode on the base substrate.

Optionally, the fourth electrode is made of a metal oxide material; and the second electrode is made of a metallic material.

Optionally, the organic light emitting diode display panel further comprises a pixel driving circuit in, the pixel; wherein the pixel driving circuit comprises a first switch thin film transistor and a first driving thin film transistor for controlling light emission in the first subpixel, a second switch thin film transistor and a second driving thin film transistor for controlling light emission in the second subpixel, and a third switch thin film transistor and a third driving thin film transistor for controlling light emission in the third subpixel; a drain electrode of the first driving thin film transistor is electrically connected to the first electrode; a drain electrode of the second driving thin film transistor is electrically connected to the first electrode; and a drain electrode of the third driving thin film transistor is electrically connected to the second electrode.

Optionally, the organic light emitting diode display panel further comprises an electron injection layer between the second electrode and the first organic light emitting layer, and between the second electrode and the second organic light emitting layer.

Optionally, the third organic light emitting layer is a blue light emitting layer for emitting a blue light.

Optionally, the first electrode is a reflective electrode, the second electrode and the third electrode are substantially transparent electrodes.

In another aspect, the present invention provides an organic light emitting diode display apparatus comprising the organic light emitting diode display panel described herein or fabricated by a method described herein.

In another aspect, the present invention provides a method of driving an organic light emitting diode display panel, wherein the organic light emitting diode display panel-comprises a base substrate; a pixel definition layer on the base substrate for defining a pixel comprising at least a first subpixel, a second subpixel, and a third subpixel; a first electrode on the base substrate and in the first subpixel and the second subpixel; a first organic light emitting layer for emitting light of a first color in the first subpixel, the first organic light emitting layer on a side of the first electrode distal to the base substrate; a second organic light emitting layer for emitting light of a second color in the second subpixel, the second organic light emitting layer on a side of the first electrode distal to the base substrate; a second electrode on a side of the first organic light emitting layer and the second organic light emitting layer distal to the first electrode, the first electrode and the second electrode configured to drive light emission of the first organic light emitting layer in the first subpixel and light emission of the second organic light emitting layer in the second subpixel; a third organic light emitting layer for emitting light of a third color on a side of the second electrode distal to the base substrate; a third electrode on a side of the third organic light emitting layer distal to the base substrate, the second electrode and the third electrode configured to drive light emission of the third organic light emitting layer; and a pixel driving circuit; wherein the pixel driving circuit comprises a first switch thin film transistor and a first driving thin film transistor for controlling light emission in the first subpixel, a second switch thin film transistor and a second driving thin film transistor for controlling light emission in the second subpixel, and a third switch thin film transistor and a third driving thin film transistor for controlling light emission in the third subpixel; a drain electrode of the first driving thin film transistor is electrically connected to the first electrode; a drain electrode of the second driving thin film transistor is electrically connected to the first electrode; a drain electrode of the third driving thin film transistor is electrically connected to the second electrode; the method comprises driving the organic light emitting diode display panel in a time-division driving mode comprising a first light emission mode and a second light emission mode; wherein in a first light emission mode, turning on the first switch thin film transistor, the second switch thin film transistor, and the third switch thin film transistor, providing a high voltage signal to a source electrode of the first driving thin film transistor, providing a high voltage signal to a source electrode of the second driving thin film transistor, and providing a low voltage signal to a source electrode of the third driving thin film transistor; and in a second light emission mode, turning off the first switch thin film transistor and the second switch thin film transistor, turning on the third switch thin film transistor, providing a high voltage signal to a source electrode of the third driving thin film transistor; wherein the first subpixel and the second subpixel are driven to emit tight in the first light emission mode and substantially not emit light in the second light emission mode; and the third subpixel is driven to emit light in the second light emission mode and substantially not emit light in the first light emission mode.

In another aspect, the present invention provides a method of fabricating an organic light emitting diode display panel, comprising forming a pixel definition layer on a base substrate for defining a pixel comprising at least a first subpixel, a second subpixel, and a third subpixel; forming a first electrode on the base substrate and in the first subpixel and the second subpixel; forming a first organic light emitting layer for emitting light of a first color in the first subpixel, the first organic light emitting layer on a side of the first electrode distal to the base substrate; forming a second organic light emitting layer for emitting light of a second color in the second subpixel, the second organic light emitting layer on a side of the first electrode distal to the base substrate; forming a second electrode on a side of the first organic light: emitting layer and the second organic light emitting layer distal to the first electrode, the first electrode and the second electrode configured to drive light emission of the first organic light emitting layer in the first subpixel and light emission of the second organic light emitting layer in the second subpixel; forming a third organic light emitting layer for emitting light of a third color on a side of the second electrode distal to the base substrate; and forming a third electrode on a side of the third organic light emitting layer distal to the base substrate, the second electrode and the third electrode configured to drive light emission of the third organic light emitting layer.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
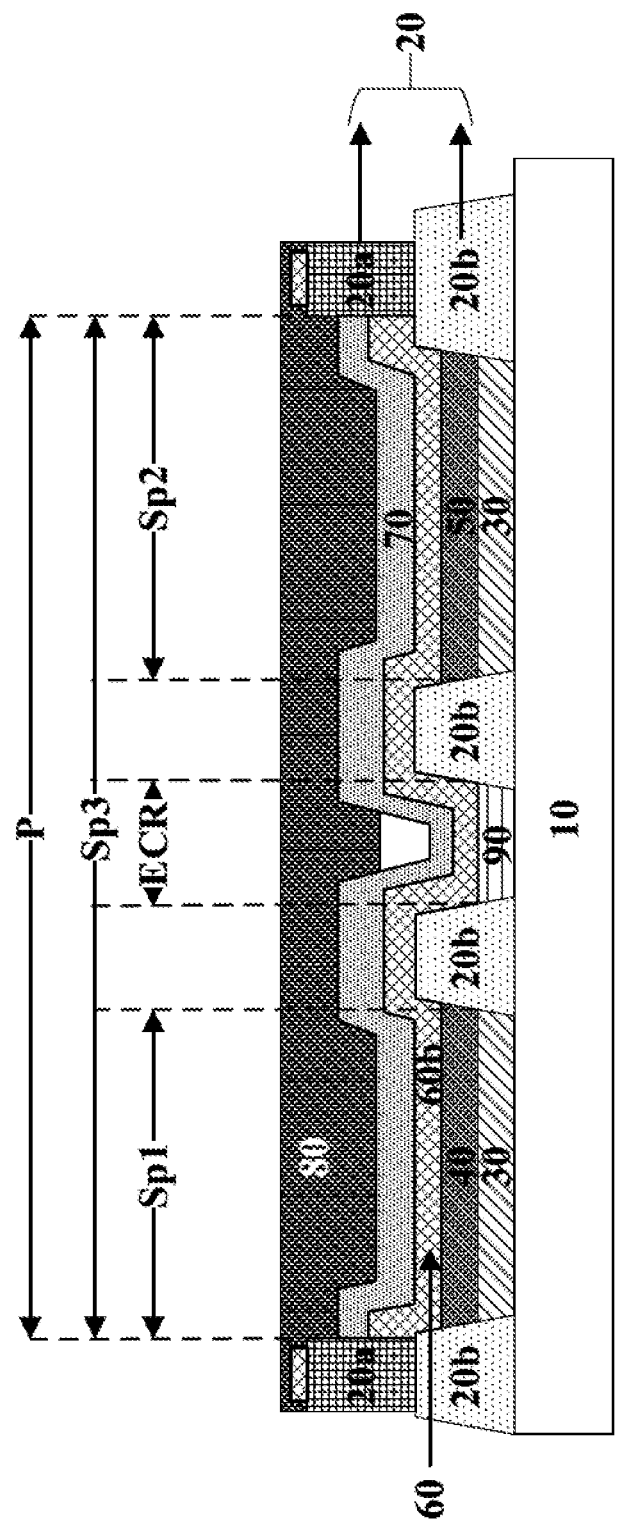
FIG. 1 is a schematic diagram illustrating the structure of an organic light emitting diode display panel in some embodiments according to the present disclosure.

The disclosure will now be described more specifically with reference to the following embodiments. It is to be noted that the following descriptions of some embodiments are presented herein for purpose of illustration and description only. It is not intended to he exhaustive or to be limited to the precise form disclosed.

Typically, a conventional organic light emitting display apparatus includes an array substrate having a plurality of pixel units, each of which contains a light emitting diode. The conventional light emitting diode includes an anode layer, a hole injection layer, a hole transport layer, a light emitting layer, an electron transport layer, an electron injection layer, and a cathode layer. In fabricating an organic light emitting display panel having a conventional light emitting diode, the light emitting diode is typically formed by vapor deposition utilizing a mask plate. For making a conventional light emitting diode having three light emitting layers of three different colors, vapor deposition processes using three different mask plates each having an opening corresponding to a different position on the light emitting diode are required. Each light emitting layer has to be accurately deposited on the substrate. This demands a high alignment accuracy, making the manufacturing process more complicated. Alternatively, the light emitting layers may be made by printing or coating an ink having a light emitting material on the base substrate. However, it is difficult to use a printing or coating method to make light emitting layers having excellent performance and an extended life time, particularly for a blue light emitting layer.

Accordingly, the present disclosure provides, inter alia, an organic light emitting diode display panel, an organic light emitting diode display apparatus, a method of driving an organic light emitting diode display panel, and a method of fabricating an organic light emitting diode display panel that substantially obviate one or more of the problems due to limitations and disadvantages of the related art. In one aspect, the present disclosure provides an organic light emitting diode display panel. In some embodiments, the organic light emitting diode display panel includes a base substrate; a pixel definition layer on the base substrate for defining a pixel including at least a first subpixel, a second subpixel, and a third subpixel; a first electrode on the base substrate and in the first subpixel and the second subpixel; a first organic light emitting layer for emitting light of a first color in the first subpixel, the first organic light emitting layer on a side of the first electrode distal to the base substrate; a second organic light emitting layer for emitting light of a second color in the second subpixel, the second organic light emitting layer on a side of the first electrode distal to the base substrate; a second electrode on a side of the first organic light emitting layer and the second organic light emitting layer distal to the first electrode, the first electrode and the second electrode configured to drive light emission of the first organic light emitting layer in the first subpixel and light emission of the second organic light emitting layer in the second subpixel; a third organic light emitting layer for emitting light of a third color on a side of the second electrode distal to the base substrate; and a third electrode on a side of the third organic light emitting layer distal to the base substrate, the second electrode and the third electrode configured to drive light emission of the third organic light emitting layer.

Figure 3:
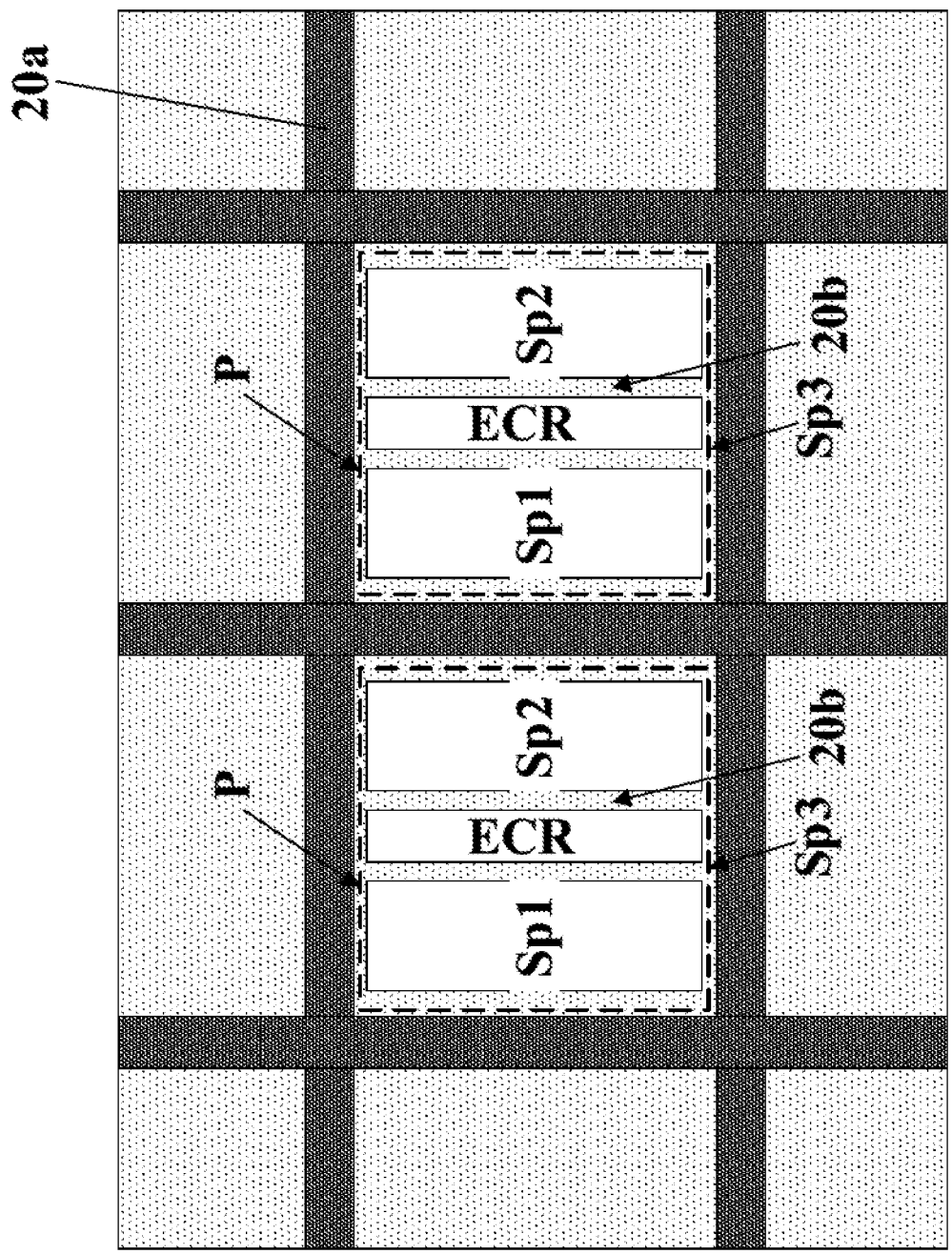
FIG. 3 is a plan view of the organic light emitting diode display panel in FIG. 1.

FIG. 1 is a schematic diagram illustrating the structure of an organic light emitting diode display panel in some embodiments according to the present disclosure. FIG. 3 is a plan view of the organic light emitting diode display panel in FIG. 1. Referring to FIG. 1 and FIG. 3, the organic light emitting diode display panel in some embodiments includes a base substrate 10, a pixel definition layer 20 on the base substrate 10 for defining a pixel P including at least a first subpixel Sp1, a second subpixel Sp2, and a third subpixel Sp3; a first electrode 30 on the base substrate 10 and in the first subpixel Sp1 and the second subpixel Sp2; a first organic light emitting layer 40 for emitting light of a first color in the first subpixel Sp1, the first organic light emitting layer 40 on a side of the first electrode 30 distal to the base substrate 10; a second organic light emitting layer 50 for emitting light of a second color in the second subpixel Sp2, the second organic light emitting layer 50 on a side of the first electrode 30 distal to the base substrate 10; a second electrode 60 on a side of the first organic light emitting layer 40 and the second organic light emitting layer 50 distal to the first electrode 30, the first electrode 30 and the second electrode 60 configured to drive light emission of the first organic light emitting layer 40 in the first subpixel Sp1 and light emission of the second organic light emitting layer 50 in the second subpixel Sp2; a third organic light emitting layer 70 for emitting light of a third color on a side of the second electrode 60 distal to the base substrate 10; and a third electrode 80 on a side of the third organic light emitting layer 70 distal to the base substrate 10, the second electrode 60 and the third electrode 80 configured to drive light emission of the third organic light emitting layer 70.

Optionally, the first electrode is a reflective electrode, the second electrode and the third electrode are substantially transparent electrodes. Optionally, the organic light emitting diode display panel is a top emission organic light emitting diode display panel. As used herein, the term "substantially transparent" mean at least 50 percent (e.g., at least 60 percent, at least 70 percent, at least 80 percent, at least 90 percent, and at least 95 percent) of light in the visible wavelength range transmitted therethrough.

Figure 2:
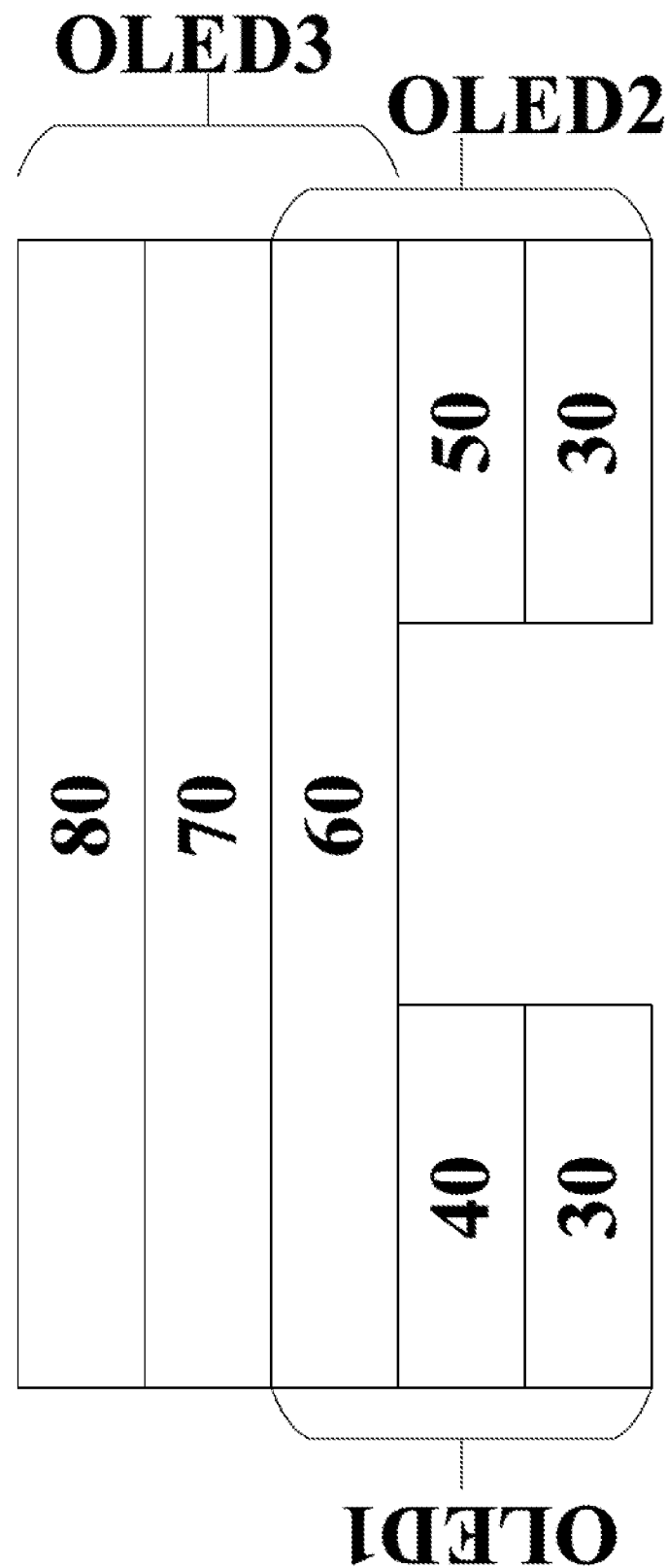
FIG. 2 is a schematic diagram illustrating the structure of an organic light emitting diodes in an organic light emitting diode display panel in some embodiments according to the present disclosure.

FIG. 2 is a schematic diagram illustrating the structure of an organic light emitting diodes in an organic light emitting diode display panel in some embodiments according to the present disclosure. Referring to FIG. 2, in some embodiments, the organic light emitting diode display panel includes at least a first organic light emitting diode OLED1 in the first subpixel Sp1, a second organic light emitting diode OLED2 in the second subpixel Sp2, and a thud organic light emitting diode OLED3 in the third subpixel Sp3. The first organic light emitting diode OLED1 in the first subpixel Sp1 is formed by at least the first electrode 30, the first organic light emitting layer 40, and the second electrode 60. The second organic light emitting diode OLED2 in the second subpixel Sp2 is formed by at least the first electrode 30, the second organic light emitting layer 50, and the second electrode 60. The third organic light emitting diode OLED3 in the thud subpixel Sp3 is formed by at least the second electrode 60, the third organic light emitting layer 70, and the third electrode 80.

As shown in FIG. 1, in some embodiments, an orthographic projection of the third subpixel Sp3 on the base substrate 10 at least partially overlaps with an orthographic projection of the first subpixel Sp1 on the base substrate 10 and at least partially overlaps with an orthographic projection of the second subpixel Sp2 on the base substrate 10. Optionally, the orthographic projection of the third subpixel Sp3 on the base substrate 10 substantially covers the orthographic projection of the first subpixel Sp1 on the base substrate 10 and the orthographic projection of the second subpixel Sp2 on the base substrate 10. Optionally, the area of the third subpixel Sp3 is substantially the same as an area of the pixel P. Optionally, an area of the third subpixel Sp3 is greater than the sum of an area of first subpixel Sp1 and an area of the second subpixel Sp2. Optionally, the second electrode 60 extends substantially throughout an entire area of the pixel P. Optionally, the third organic light emitting layer 70 extends substantially throughout an entire area of the pixel P.

Optionally, the orthographic projection of the first subpixel Sp1 on the base substrate 10 and the orthographic projection of the second subpixel Sp2 on the base substrate 10 are substantially non-overlapping, with each other. Optionally, the orthographic projection of the first subpixel Sp1 on the base substrate 10 and the orthographic projection of the second subpixel Sp2 on the base substrate 10 at least partially overlap with each other.

Optionally, the first color, the second color, and the third color are three different colors. Optionally, the first color, the second color, and the third color are three different colors selected from red, green, and blue. Optionally, the first color, the second color, and the third color are three different colors selected from yellow, cyan, and magenta. Optionally, the third color is blue color, e.g., the third organic light emitting layer includes a blue light emitting material. Optionally, the third color is red color, e.g., the third organic light emitting layer includes a red light emitting material. Optionally, the third color is green color, e.g., the third organic light emitting layer includes a green light emitting material. Optionally, the first organic light emitting layer 40 is printed in the first subpixel Sp1 using an ink including a first light emitting material. Optionally, the second organic light emitting layer 50 is printed in the second subpixel Sp2 using an ink including a second light emitting material. Optionally, the third organic light emitting layer 70 is formed in the third subpixel Sp3 by depositing a third light emitting material, e.g., using a vapor deposition method.

In some embodiments, the third organic light emitting layer 70 is a continuous layer extending substantially throughout the entire pixel P. Accordingly, the present organic light emitting diode display panel has a much greater aperture ratio as compared to the conventional display panel. Optionally, a light emitting material may have much higher performance when deposited by vapor deposition as compared to when deposited by printing or coating, and the light emitting material may be selected for forming the third organic light emitting layer 70. In one example, the third organic light emitting layer 70 includes a blue light emitting material, because the blue light emitting material has much higher performance when deposited by vapor deposition as compared to when deposited by printing or coating. As a result, the organic light emitting diode display panel can have a higher display quality and a longer life time.

In some embodiments, an orthographic projection of the second electrode 60 on the base substrate 10 at least partially overlaps with an orthographic projection of the first electrode 30 on the base substrate 10. Optionally, the orthographic projection of the second electrode 60 on the base substrate 10 substantially covers the orthographic projection of the first electrode 30 on the base substrate 10.

In some embodiments, an orthographic projection of the second electrode 60 on the base substrate 10 at least partially overlaps with an orthographic projection of the first organic light emitting layer 40 the base substrate 10 and at least partially overlaps with an orthographic projection of the second organic light emitting layer 50 un the base substrate 10. Optionally, the orthographic projection of the second electrode 60 on the base substrate 10 substantially covers the orthographic projection of the first organic light emitting layer 40 on the base substrate 10 and the orthographic projection of the second organic light emitting layer 50 on the base substrate 10.

In some embodiments, an orthographic projection of the third organic light emitting layer 70 on the base substrate 10 at least partially overlaps with an orthographic projection of the first organic light emitting layer 40 on the base substrate 10 and at least partially overlaps with an orthographic projection of the second organic light emitting layer 50 on the base substrate 10. Optionally, the orthographic projection of the third organic light emitting layer 70 on the base substrate 10 substantially covers the orthographic projection of the first organic light emitting layer 40 on the base substrate 10 and the orthographic projection of the second organic light emitting layer 50 on the base substrate 10. Optionally, the orthographic projection of the first organic light emitting layer 40 on the base substrate 10 and the orthographic projection of the second organic light emitting layer 50 on the base substrate 10 are substantially non-overlapping with each other.

In some embodiments, an orthographic projection of the third organic light emitting layer 70 on the base substrate 10 at least partially overlaps with an orthographic projection of the first electrode 30 on the base substrate 10. Optionally, the orthographic projection of the third organic light emitting layer 70 on the base substrate 10 substantially covers the orthographic projection of the first electrode 30 on the base substrate 10.

In some embodiments, the organic light emitting diode display panel further includes an electron injection layer between the second electrode and the first organic light emitting layer, and between the second electrode and the second organic light emitting layer. Optionally, the electron injection layer includes a metal halide compound such as lithium fluoride and sodium fluoride.

Figure 4:
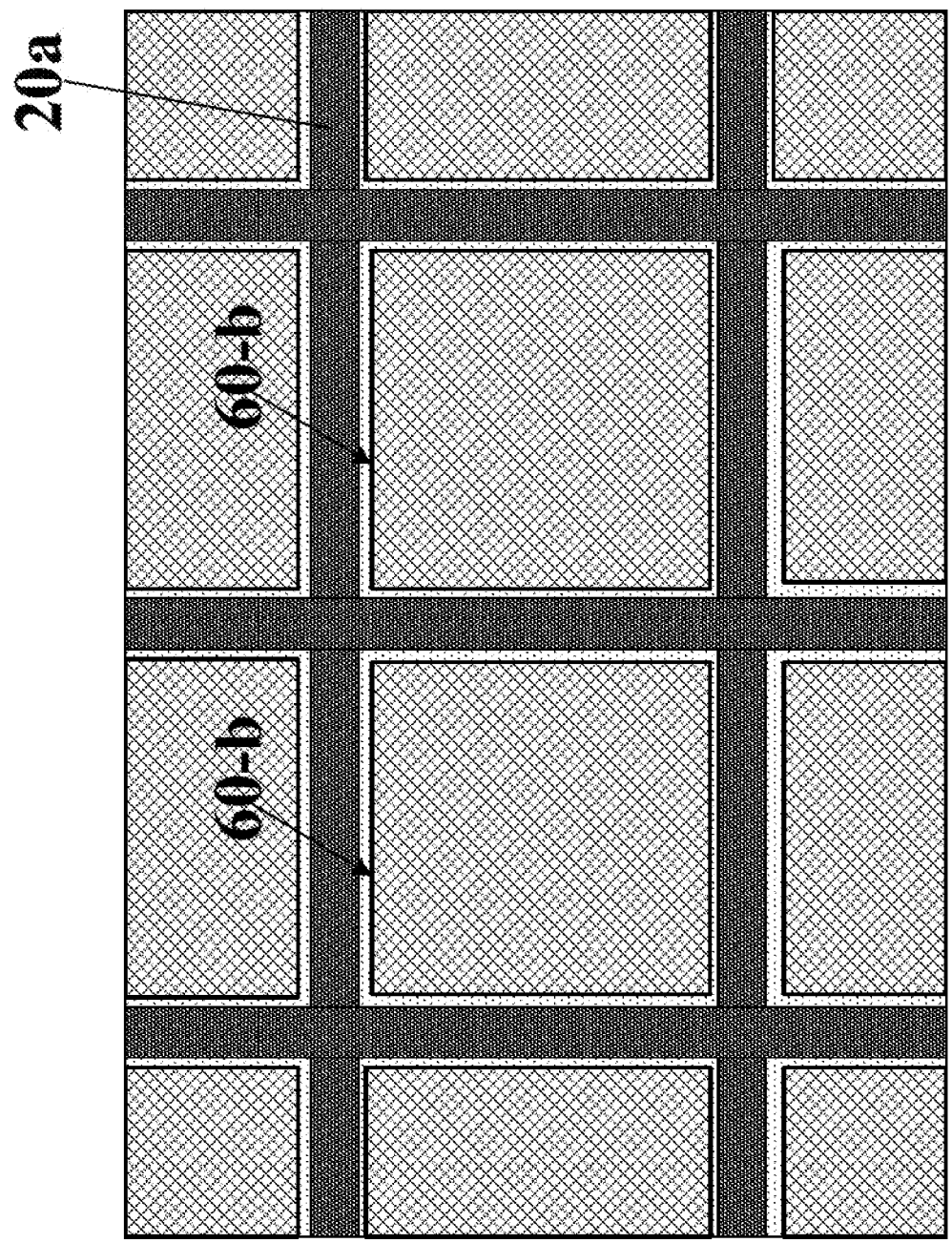
FIG. 4 is a schematic diagram illustrating the structure of a second electrode in an organic light emitting diode display panel in some embodiments according to the present disclosure.

FIG. 4 is a schematic diagram illustrating the structure of a second electrode in an organic light emitting diode display panel in some embodiments according to the present disclosure. Referring to FIG. 1 and FIG. 4, the second electrode 60 includes a plurality of second electrode blocks 60b respectively in a plurality of pixels P. The plurality of second electrode blocks 60b in adjacent pixels of the plurality of pixels P are insulated and spaced apart from each other. The plurality of second electrode blocks 60b may be formed by any appropriate methods. In one example, the plurality of second electrode blocks 60b are formed by first depositing an electrode material layer on the base substrate 10, followed by patterning the electrode material layer to form the plurality of second electrode blocks 60b.

In some embodiments, the plurality of second electrode blocks 60b are formed by depositing an electrode material layer on the base substrate 10 without further patterning. In one example, the pixel definition layer 20 includes a first sub-layer 20a in regions between adjacent pixels and absent in regions between adjacent subpixels in a same pixel. The first sub-layer 20a has a slope angle that is sufficiently steep such that the electrode material layer disconnects at the first sub-layer 20a due to the steep slope angle of the first sub-layer 20a.

Figure 5:
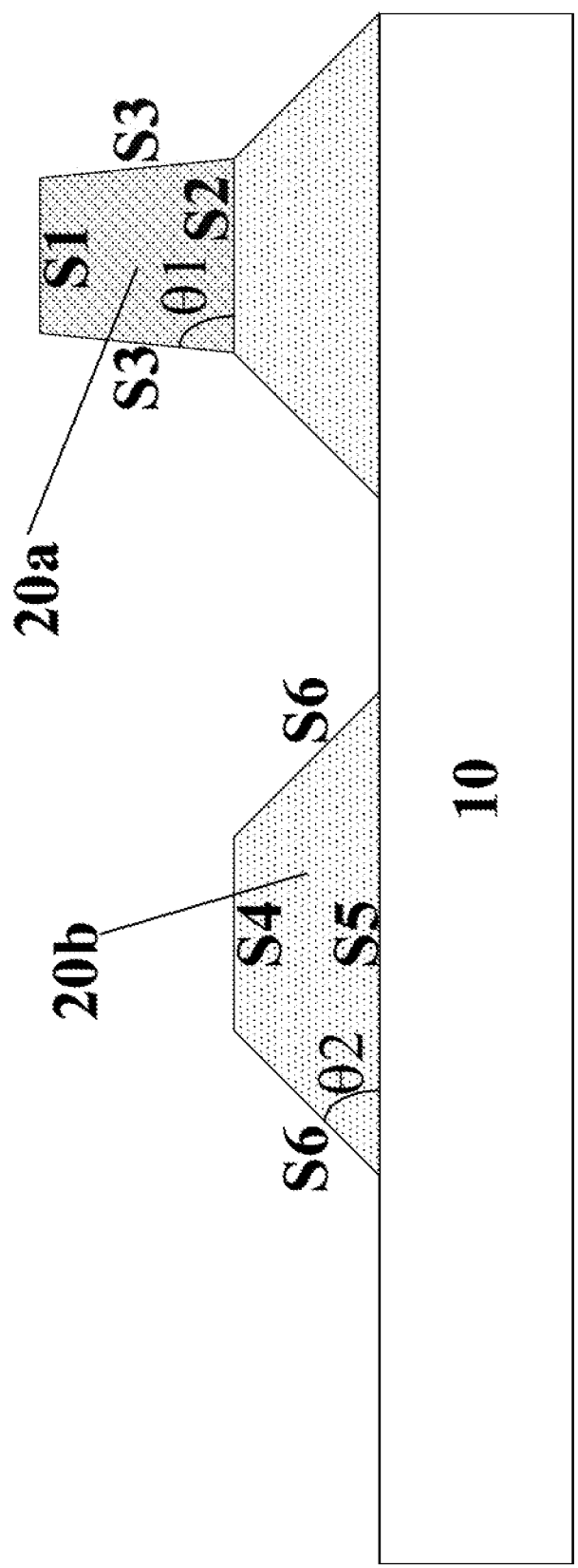
FIG. 5 is a schematic diagram illustrating the structure of a pixel definition layer in an organic light emitting diode display panel in some embodiments according to the present disclosure.

FIG. 5 is a schematic diagram illustrating the structure of a pixel definition layer in an organic light emitting diode display panel in some embodiments according to the present disclosure. Referring to FIG. 5, the first sub-layer 20a of the pixel definition layer 20 has a first side S1 and a second side S2 substantially opposite to each other and a third side S3 connecting the first side S1 and the second side S2, the first side S1 on a side of the second side S2 distal to the base substrate 10. Referring to FIG. 1 and FIG. 5, the third side S3 of the first sub-layer 20a has a first slope angle $\theta 1$ with respect to the second side S2 of the first sub-layer 20a that is sufficiently steep such that, when the electrode material of the second electrode 60 is deposited on the pixel definition layer 20, the electrode material does not fully cover the third side S3, resulting in a break in the second electrode 60 at or around the first sub-layer 20a. The second electrode 60 so formed includes a plurality of second electrode blocks 60b. Optionally, the first slope angle $\theta 1$ is greater than approximately 60 degrees. Optionally, the first slope angle $\theta 1$ is in a range of approximately 60 degrees to approximately 90 degrees, e.g., approximately 70 degrees to approximately 90 degrees, and approximately 80 degrees to approximately 90 degrees. As shown in FIG. 4, the plurality of second electrode blocks 60b in adjacent pixels of the plurality of pixels P are insulated from each other by the first sub-layer 20a.

Optionally, the first sub-layer 20a has a thickness in a range of approximately 20 nm to approximately 500 nm, e.g., approximately 20 nm to approximately 200 nm, approximately 200 nm to approximately 400 nm, and approximately 400 nm to approximately 500 nm. Optionally, the first sub-layer 20a is made of one or a combination of silicon oxide ($SiO_y$), silicon nitride ($SiN_y$, e.g., $Si_3N_4$), and silicon oxynitride ($SiO_xN_y$).

Optionally, the second electrode 60 has a thickness in a range of approximately 7 nm to approximately 20 nm. Optionally, the first electrode 30 has a thickness in a range of approximately 20 nm to approximately 200 nm.

In some embodiments, and as shown in FIG. 1 and FIG. 5, the pixel definition layer 20 further includes a second sub-layer 20b in regions between adjacent subpixels. Optionally, the second sub-layer 20b is limited to regions between adjacent subpixels within a same pixel. Optionally, the second sub-layer 20b is not limited to regions between adjacent subpixels within a same pixel (intra-pixel adjacent subpixels), but also in regions between adjacent subpixels each from one of two adjacent pixels (inter-pixel adjacent subpixels). Optionally, and as shown in FIG. 5, the second sub-layer 20b is on a side of the first sub-layer 20a proximal to the base substrate 10. Referring to FIG. 5, the second sub-layer 20b of the pixel definition layer 20 has a fourth side S4 and a fifth side S5 substantially opposite to each other and a sixth side S6 connecting the fourth side S4 and the fifth side S5, the fourth side S4 on a side of the fifth side S5 distal to the base substrate 10. Referring to FIG. 1 and FIG. 5, the sixth side S6 of the second sub-layer 20b has a second slope angle $\theta 2$ with respect to the fifth side S5 of the second sub-layer 20b. Optionally, the second slope angle $\theta 2$ is smaller than the first slope angle $\theta 1$. The second slope angle $\theta 2$ is sufficiently flat such that, when the electrode material of the second electrode 60 is deposited on the pixel definition layer 20, the electrode material fully covers the sixth side S6 of the second sub-layer 20b, particularly the second sub-layer 20b in regions other than the regions between inter-pixel adjacent subpixels. Each of the plurality of pixels P includes a single, continuous electrode block of the plurality of second electrode blocks 60b. Optionally, the second slope angle $\theta 2$ is in a range of approximately 20 degrees to approximately 40 degrees, e.g., approximately 20 degrees to approximately 30 degrees, and approximately 30 degrees to approximately 40 degrees. Optionally, the first sub-layer 20a and the second sub-layer 20b are formed using different materials. In one example, the second sub-layer 20b includes an organic material, and the first sub-layer 20a includes an inorganic material. Optionally, the first sub-layer 20a and the second sub-layer 20b are an integral pixel definition layer formed in a single patterning process (e.g., formed using a same material and patterned using a same mask plate, e.g., a half-tone or gray-tone mask plate).

Optionally, the second sub-layer 20b has a thickness in a range of approximately 20 nm to approximately 500 nm, e.g., approximately 20 nm to approximately 200 nm, approximately 200 nm to approximately 400 nm, and approximately 400 nm to approximately 500 nm. Optionally, the second sub-layer 20b is made of one or a combination of silicon oxide ($SiO_y$), silicon nitride ($SiN_y$, e.g., $Si_3N_4$), and silicon oxynitride ($SiO_xN_y$).

Optionally, each of the plurality of second electrode blocks 60b is a continuous block. Optionally, each of the plurality of second electrode blocks 60b includes a plurality of sub-blocks spaced apart but electrically connected together. Optionally, each of the plurality of second electrode blocks 60b is a metal mesh electrode block.

In some embodiments, and as shown in FIG. 1 and FIG. 3, each pixel P in the organic light emitting diode display panel further includes an electrode connecting region ECR defined by the pixel definition layer, e.g., defined by the second sub-layer 20b of the pixel definition layer 20. The second electrode 60 is electrically connected to a pixel driving circuit through the electrode connecting region ECR, In some embodiments, the second electrode 60 is directly electrically connected to the pixel driving circuit, e.g., to a drain electrode of a driving thin film transistor in the pixel driving circuit. For example, each of the plurality of second electrode blocks 60b is directly electrically connected to the drain electrode without any intervening layer or component, e.g., through the electrode connecting region ECR.

In some embodiments, each pixel P in the organic light emitting diode display panel further includes a fourth electrode 90 in the electrode connecting region. ECR, as shown in FIG. 1. The fourth electrode 90 electrically connects the second electrode 60 to the pixel driving circuit. Optionally, an orthographic projection of the second electrode 60 on the base substrate 10 substantially covers an orthographic projection of the fourth electrode 90 on the base substrate 10.

Optionally, the fourth electrode 90 is made of a metal oxide material, and the second electrode 60 is made of a metallic material.

Figure 6:
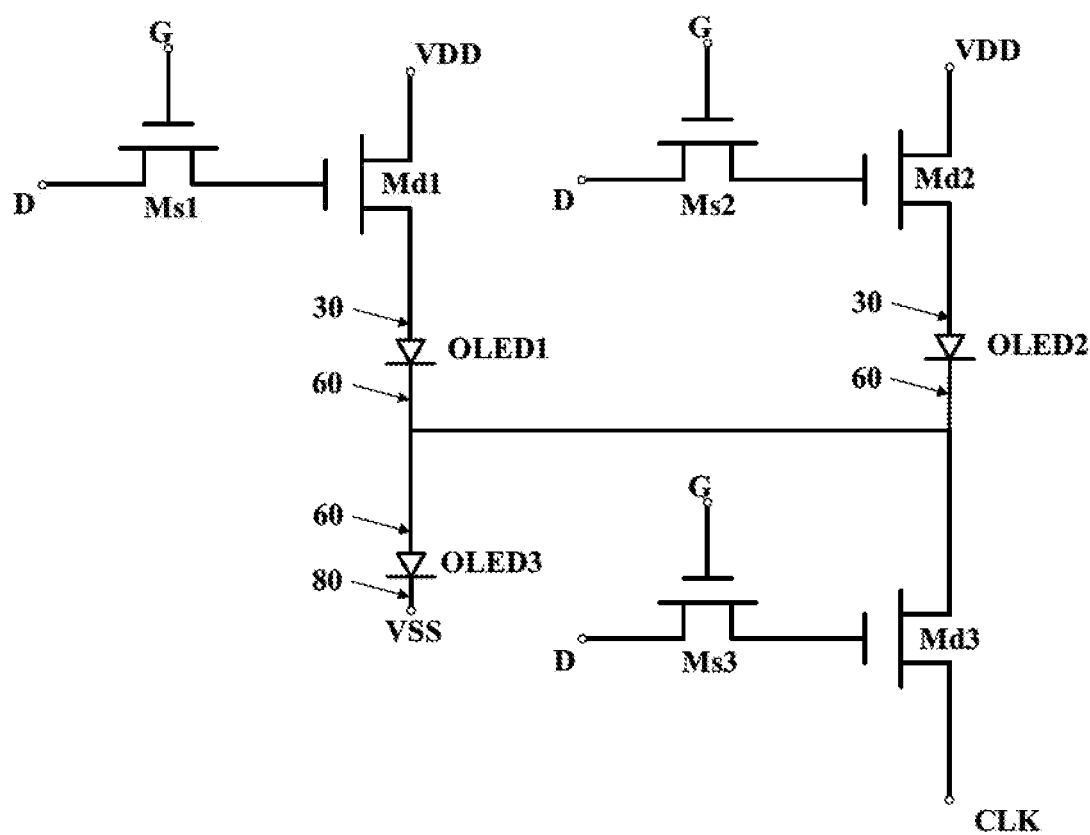
FIG. 6 is a schematic diagram illustrating the structure of a pixel driving circuit in an organic light emitting diode display panel in some embodiments according to the present disclosure.

FIG. 6 is a schematic diagram illustrating the structure of a pixel driving circuit in an organic light emitting diode display panel in some embodiments according to the present disclosure. Referring to FIG. 6, the pixel driving circuit in some embodiments includes a first switch thin film transistor Ms1 and a first driving thin film transistor Md1 for controlling light emission in the first subpixel Sp1, a second switch thin film transistor Ms2 and a second driving thin film transistor Md2 for controlling light emission in the second subpixel Sp2, and a third switch thin film transistor Ms3 and a third driving thin film transistor Md3 for controlling light emission in the third subpixel Sp3. The gate electrode of the first switch thin film transistor Ms1 is electrically connected to one of a plurality of gate line G, the source electrode of the first switch thin film transistor Ms1 is electrically connected to one of a plurality of data lines D, and the drain electrode of the first switch thin film transistor Ms1 is electrically connected to the gate electrode of the first driving thin film transistor Md1. The source electrode of the first driving thin film transistor Md1 is configured to be provided with a high voltage signal VDD, the drain electrode of the first driving thin film transistor Md1 is electrically connected to the first organic light emitting diode OLED1, e.g., the drain electrode of the first driving thin film transistor Md1 is electrically connected to the first electrode 30. The gate electrode of the second switch thin film transistor Ms2 is electrically connected to one of a plurality of gate line G, the source electrode of the second switch thin film transistor Ms2 is electrically connected to one of a plurality of data lines D, and the drain electrode of the second switch thin film transistor Ms2 is electrically connected to the gate electrode of the second driving thin film transistor Md2. The source electrode of the second driving thin film transistor ma is configured to be provided with a high voltage signal VDD, the drain electrode of the second driving thin film transistor Md2 is electrically connected to the second organic light emitting diode OLED2, e.g., the drain electrode of the second driving thin film transistor Md2 is electrically connected to the first electrode 30. The gate electrode of the third switch thin film transistor Ms3 is electrically connected to one of a plurality of gate line G, the source electrode of the third switch thin film transistor Ms3 is electrically connected to one of a plurality of data lines D, and the drain electrode of the third switch thin film transistor Ms3 is electrically connected to the gate electrode of the third driving thin film transistor Md3. The source electrode of the third driving thin film transistor Md3 is configured to be provided with a clock voltage signal CLK, the drain electrode of the third driving thin film transistor Md3 is electrically connected to the third organic light emitting diode OLED3, e.g., the drain electrode of the third driving thin film transistor Md3 is electrically connected to the second electrode 60. As discussed above, and as shown in FIG. 2, the second electrode 60 serves as one of the electrodes for the third organic light emitting diode OLED3, and also serves as one of the electrodes for the first organic light emitting diode OLED1 and one of the electrodes for the second organic light emitting diode OLED2.

The first organic light emitting diode OLED1 in the first subpixel Sp1 is formed by the first electrode 30, the first organic light emitting layer 40, and the second electrode 60. The second organic light emitting diode OLED2 in the second subpixel Sp2 is formed by the first electrode 30, the second organic light emitting layer 50, and the second electrode 60. The third organic light emitting diode OLED3 in the third subpixel Sp3 is formed by the second electrode 60, the third organic light emitting layer 70, and the third electrode 80.

In another aspect, the present disclosure provides a method of driving an organic light emitting diode display panel. In some embodiments, the method includes driving the organic light emitting diode display panel in a time-division driving mode having a first light emission mode and a second light emission mode. In the first light emission mode, the first organic light emitting diode OLED1 in the first subpixel Sp1 and the second organic light emitting diode OLED2 in the second subpixel Sp2 are configured to emit light, whereas the third organic light emitting diode OLED3 in the third subpixel Sp3 is configure not to emit light.

In some embodiments, and referring to FIG. 6, in the first light emission mode, the method includes turning on the first switch thin film transistor Ms1, the second switch thin film transistor Ms2, and the thud switch thin film transistor Ms3. For example, a gate scanning signal having a high voltage level is provided to the gate line(s) electrically connected respectively to the gate electrodes of the first switch thin film transistor Ms1, the second switch thin film transistor Ms2, and the third switch thin film transistor Ms3, thereby turning on the first switch thin film transistor Ms1, the second switch thin film transistor Ms2, and the third switch thin film transistor Ms3. In the first light emission mode, the method further includes providing a high voltage signal VDD to a source electrode of the first driving thin film transistor Md1, providing a high voltage signal VDD to a source electrode of the second driving thin film transistor Md2, and providing a low voltage signal VSS to a source electrode of the third driving thin film transistor Md3, in one example, the voltage signal provided to the source electrode of the third driving thin film transistor Md3 is a clock voltage signal CLK, which has a low voltage level VSS in the first light emission mode. As shown in FIG. 6, in the first light emission mode, the voltage level difference between the second electrode 60 and the third electrode 80 is substantially zero as the voltage signals provided to the second electrode 60 and the third electrode 80 are both a low voltage signal VSS. The third organic light emitting diode OLED3 in the third subpixel Sp3 substantially does not emit light. The voltage level difference between the first electrode 30 and the second electrode 60 is (VDD-VSS), thus the first organic light emitting diode OLED1 in the first subpixel Sp1 and the second organic light emitting diode OLED2 in the second subpixel Sp2 are configured to emit light In the second light emission mode, the method includes turning off the first switch thin film transistor Ms1 and the second switch thin film transistor Ms2, and turning on the third switch thin film transistor Ms3. For example, a gate scanning signal having a low voltage level is provided to the gate line(s) electrically connected respectively to the gate electrodes of the first switch thin film transistor Ms1 and the second switch thin film transistor Ms2, thereby turning off the first switch thin film transistor Ms1 and the second switch thin film transistor Ms2. A gate scanning signal having a high voltage level is provided to the gate line electrically connected to the gate electrode of the third switch thin film transistor Ms3, thereby turning on the third switch thin film transistor Ms3. In the second light emission mode, the method further includes providing a high voltage signal VDD to the source electrode of the third driving thin film transistor Md3. In one example, the voltage signal provided to the source electrode of the third driving thin film transistor Md3 is a clock voltage signal CLK, which has a high voltage level VDD in the second light emission mode. As shown in FIG. 6, in the second light emission mode, the voltage level difference between the second electrode 60 and the third electrode 80 is (VDD-VSS). The thud organic light emitting diode OLED3 in the third subpixel Sp3 is configured to emit light.

In another aspect, the present disclosure provides a method of fabricating an organic light emitting diode display panel. In some embodiments, the method includes forming a pixel definition layer on a base substrate for defining a pixel having at least a first subpixel, a second subpixel, and a third subpixel; forming a first electrode on the base substrate and in the first subpixel and the second subpixel; forming a first organic light emitting layer for emitting light of a first color in the first subpixel, the first organic light emitting layer on a side of the first electrode distal to the base substrate; forming a second organic light emitting layer for emitting light of a second color in the second subpixel, the second organic light emitting layer on a side of the first electrode distal to the base substrate; formula a second electrode on a side of the first organic light emitting layer and the second organic light emitting layer distal to the first electrode, the first electrode and the second electrode configured to drive light emission of the first organic light emitting layer in the first subpixel and light emission of the second organic light emitting layer in the second subpixel; forming a third organic light emitting layer for emitting light of a third color on a side of the second electrode distal to the base substrate; and forming a third electrode on a side of the third organic light emitting layer distal to the base substrate, the second electrode and the third electrode configured to drive light emission of the third organic light emitting layer.

Optionally, the method of fabricating the organic light emitting diode display panel at least includes forming a first organic light emitting diode in the first subpixel, forming a second organic light emitting diode in the second subpixel, and forming a third organic light emitting diode in the third subpixel. The first organic light emitting diode in the first subpixel is formed by at least the first electrode, the first organic light emitting layer, and the second electrode, The second organic light emitting diode in the second subpixel is formed by at least the first electrode, the second organic light emitting layer, and the second electrode. The third organic light emitting diode in the third subpixel is formed by at least the second electrode, the third organic light emitting layer, and the third electrode.

In some embodiments, the organic light emitting diode display panel is formed so that an orthographic projection of the third subpixel on the base substrate at least partially overlaps with an orthographic projection of the first subpixel on the base substrate and at least partially overlaps with an orthographic projection of the second subpixel on the base substrate. Optionally, the organic light emitting diode display panel is formed so that the orthographic projection of the third subpixel on the base substrate substantially covers the orthographic projection of the first subpixel on the base substrate and the orthographic projection of the second subpixel on the base substrate. Optionally, the organic light emitting diode display panel is formed so that the area of the third subpixel is substantially the same as an area of the pixel. Optionally, the organic light emitting diode display panel is formed so that an area of the third subpixel is greater than the sum of an area of first subpixel and an area of the second subpixel. Optionally, the organic light emitting diode display panel is formed so that the second electrode extends substantially throughout an entire area of the pixel. Optionally, the organic light emitting diode display panel is formed so that the third organic light emitting layer extends substantially throughout an entire area of the pixel.

Optionally, the organic light emitting diode display panel is formed so that the orthographic projection of the first subpixel on the base substrate and the orthographic projection of the second subpixel on the base substrate are substantially non-overlapping with each other. Optionally, the organic light emitting diode display panel is formed so that the orthographic projection of the first subpixel on the base substrate and the orthographic projection of the second subpixel on the base substrate at least partially overlap with each other.

Optionally, the first color, the second color, and the third color are three different colors. Optionally, the first color, the second color, and the third color are three different colors selected from red, green, and blue. Optionally, the first color, the second color, and the third color are three different colors selected from yellow, cyan, and magenta. Optionally, the third color is blue color, e.g., the third organic light emitting layer includes a blue light emitting material. Optionally, the third color is red color, e.g., the third organic light emitting layer includes a red light emitting material. Optionally, the third color is green color, e.g., the third organic light emitting layer includes a green light emitting material.

Figure 7A:
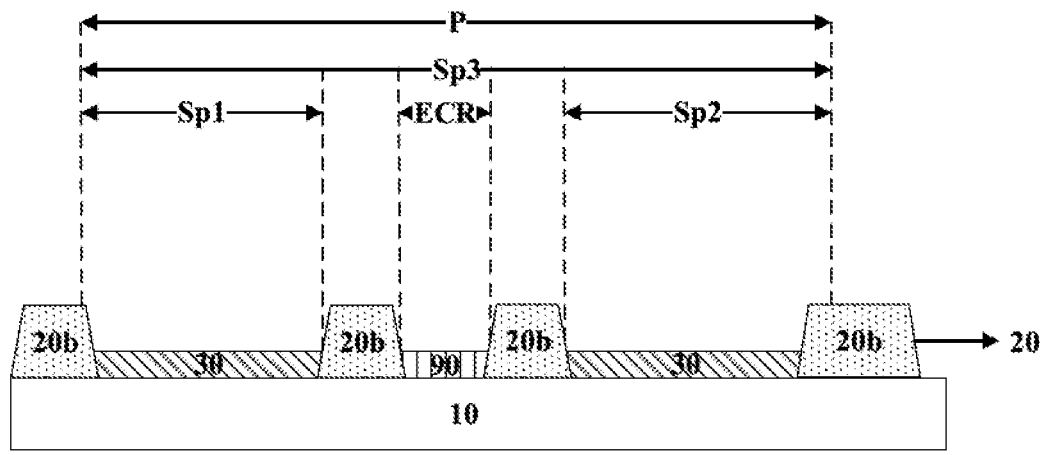
FIGS. 7A to 7F illustrate a process of fabricating an organic light emitting diode display panel in some embodiments according to the present disclosure.

FIGS. 7A to 7F illustrate a process of fabricating an organic light emitting diode display panel in some embodiments according to the present disclosure. Referring to FIG. 7A, the method in some embodiments includes forming a second sub-layer 20b of a pixel definition layer 20 on the base substrate 10. The second sub-layer 20b is formed in regions between adjacent subpixels within a same pixel (intra-pixel adjacent subpixels), as well as in regions between adjacent subpixels each from one of two adjacent pixels (inter-pixel adjacent subpixels). Thus, the second sub-layer 20b is formed to define a plurality of subpixels in the organic light emitting diode display panel, including at least the first subpixel Sp1, the second subpixel Sp2, and the third subpixel Sp3. The method further includes forming a first electrode 30 on the base substrate 10 and in the first subpixel Sp1 and the second subpixel Sp2. Optionally, the method further includes forming a fourth electrode 90 in an electrode connecting region ECR defined by the second sub-layer 20b of the pixel definition layer 20. Optionally, the electrode connecting region ECR is between the first subpixel Sp1 and the second subpixel Sp2. Optionally, the electrode connecting region ECR is on a side of the first subpixel Sp1 distal to the second subpixel Sp2. Optionally, the electrode connecting region ECR is on a side of the second subpixel Sp2 distal to the first subpixel Sp1.

Optionally, the second sub-layer 20b of the pixel definition layer 20 is formed to have a fourth side and a fifth side substantially opposite to each other and a sixth side connecting the fourth side and the fifth side, the fourth side on a side of the fifth side distal to the base substrate 10. Optionally, the sixth side of the second sub-layer 20b is formed to have a second slope angle with respect to the fifth side of the second sub-layer 20b. The second slope angle is sufficiently flat such that, when the electrode material of a subsequently-formed second electrode is deposited on the pixel definition layer 20, the electrode material fully covers the sixth side of the second sub-layer 20b, particularly the second sub-layer 20b in regions other than the regions between inter-pixel adjacent subpixels. Optionally, the second slope angle is in a range of approximately 20 degrees to approximately 40 degrees, e.g., approximately 20 degrees to approximately 30 degrees, and approximately 30 degrees to approximately 40 degrees.

Figure 7B:
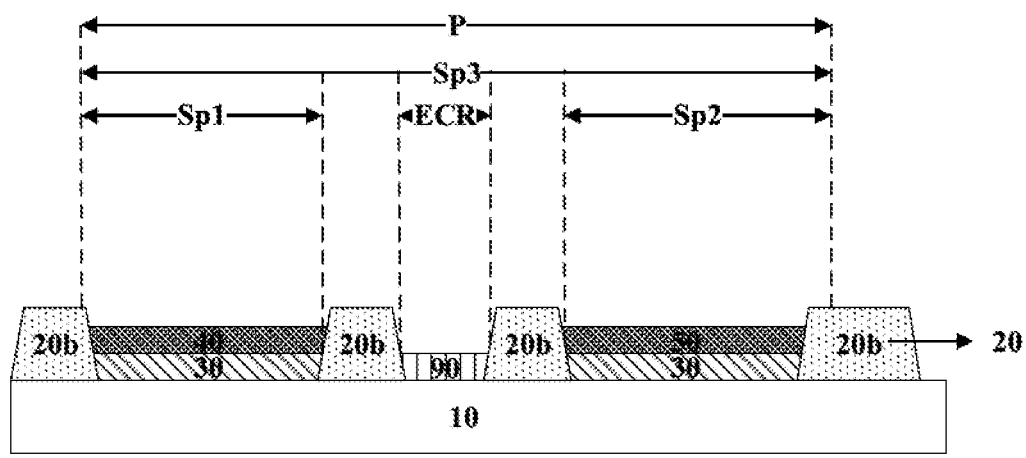

Referring to FIG. 7B, the method in some embodiments further includes forming a first organic light emitting layer 40 for emitting light of a first color in the first subpixel Sp1, the first organic light emitting layer 40 is formed on a side of the first electrode 30 distal to the base substrate 10; and forming a second organic light emitting layer 50 for emitting light of a second color in the second subpixel Sp2, the second organic light emitting layer 50 is formed on a side of the first electrode 30 distal to the base substrate 10. Optionally, the first organic light emitting layer 40 is printed or coated in the first subpixel Sp1 using an ink including a first light emitting material. Optionally, the second organic light emitting layer 50 is printed or coated in the second subpixel Sp2 using an ink including a second light emitting material. Optionally, the first light organic emitting layer 40 and the second organic light emitting layer 50 are different light emitting layers selected from a red light emitting layer and a green light emitting layer, e.g., the first light emitting material and the second light emitting material are different light emitting materials selected from a red light emitting material and a green light emitting material.

Figure 7C:
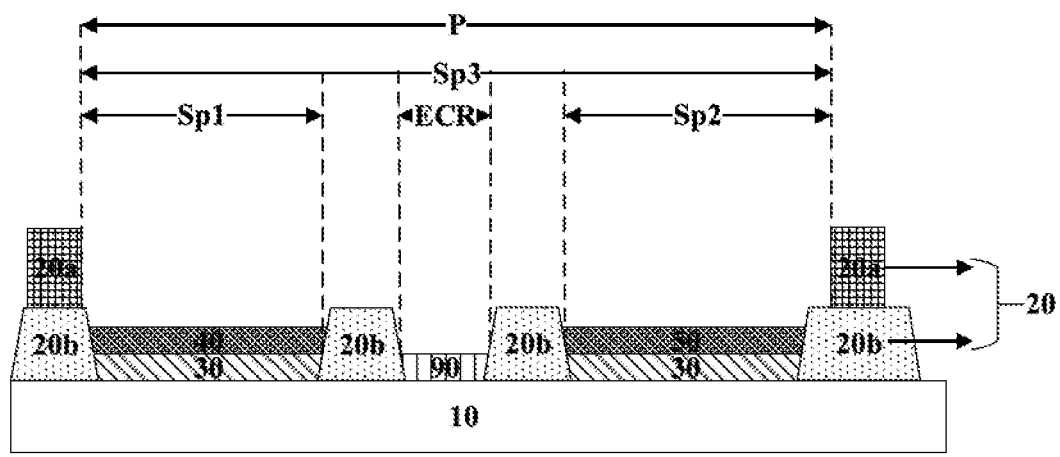

Referring to FIG. 7C, the method in some embodiments further includes funning a first sub-layer 20a of the pixel definition layer 20 in regions between adjacent pixels and absent in regions between adjacent subpixels in a same pixel. Optionally, the first sub-layer 20a is formed on a side of the second sub-layer 20b distal to the base substrate 10. Optionally, the first sub-layer 20a is formed to have a first side and a second side substantially opposite to each other and a third side connecting the first side and the second side, the first side on a side of the second side distal to the base substrate 10. Optionally, the thud side of the first sub-layer 20a is formed to have a first slope angle with respect to the second side of the first sub-layer that is sufficiently steep such that, when the electrode material of a subsequently-formed second electrode is deposited on the pixel definition layer 20, the electrode material does not fully cover the third side, resulting in a break in the subsequently-formed second electrode at or around, the first sub-layer. Optionally, the first slope angle is greater than approximately 60 degrees. Optionally, the first slope angle is in a range of approximately 60 degrees to approximately 90 degrees, e.g., approximately 70 degrees to approximately 90 degrees, and approximately 80 degrees to approximately 90 degrees. Optionally, the first slope angle is greater than the second, slope angle. Optionally, the first sub-layer 20a is formed to have a thickness in a range of approximately 20 nm to approximately 500 nm, e.g., approximately 20 nm to approximately 200 nm, approximately 200 nm to approximately 400 nm, and approximately 400 nm to approximately 500 nm.

In some embodiments, the first sub-layer 20a and the second sub-layer 20b are an integral pixel definition layer formed in a single patterning process (e.g., formed using a same material and patterned using a same mask plate). Optionally, the integral pixel definition layer is formed using a half-tone or gray-tone mask plate. The half-tone or gray-tone mask plate has a light non-transmissive region, a light semi-transmissive region, and a light fully transmissive region. Optionally, a pixel definition material layer is first formed on the base substrate, and a photoresist layer is formed on a side of the pixel definition material layer distal to the base substrate. The photoresist layer is exposed using the half-tone or gray-tone mask plate, and then developed to obtain a photoresist patterning having a first section corresponding to the light non-transmissive region, a second section corresponding to the light semi-transmissive region, and a third section corresponding to the light fully transmissive region. The first section corresponds to a region having the first sub-layer 20a stacked on the second sub-layer 20b, the second section corresponds to a region having the second sub-layer 20b only (e.g., a region having the second sub-layer 20b other than the region where the first sub-layer 20a stacked on the second sub-layer 20b), and the third section is outside of the first section and the second section. The first section is substantially unexposed, the second section is partially exposed, the third section is fully exposed, and the photoresist material is removed in the third section.

The slope angles of the first sub-layer 20a and the second sub-layer 20b may be controlled by various appropriate methods. In some embodiments, the slope angles of the first sub-layer 20a and the second sub-layer 20b are controlled by degree of exposure on the photoresist layer. The degree of exposure in the photoresist layer gradually decreases along the direction of incident UV light when the photoresist layer is exposed to the UV light. A degree of reaction between the material of the photoresist layer and a developing solution also gradually decreases along the direction of incident UV light. As a result, a portion of the photoresist material being removed from the photoresist layer in the developing step also gradually decreases along the direction of incident UV light. Accordingly, the first sub-layer 20a and the second sub-layer 20b respectively formed after the developing step can have different slope angles by controlling the degrees of exposure in the first section and the second section differently.

Optionally, the first sub-layer 20a and the second sub-layer 20b are formed using different materials. In one example, the second sub-layer 20b includes an organic material, and the first sub-layer 20a includes an inorganic material. Optionally, the first sub-layer 20a and the second sub-layer 20b are formed in a single patterning process, e.g., using a half-tone or gray-tone mask plate. Optionally, the method includes forming an organic material layer on the base substrate, forming an inorganic material layer on a side of the organic material layer, patterning the organic material layer and the inorganic material layer using a half-tone or gray-tone mask plate as described above, thereby forming the sub-layer 20a and the second sub-layer 20b. Optionally, the inorganic material layer is etched using a dry etchant to achieve a relatively large slope angle, e.g., a slope angle in a range of approximately 60 degrees to approximately 90 degrees.

Optionally, the first electrode 30 is formed to have a thickness in a range of approximately 20 nm to approximately 200 nm.

Figure 7D:
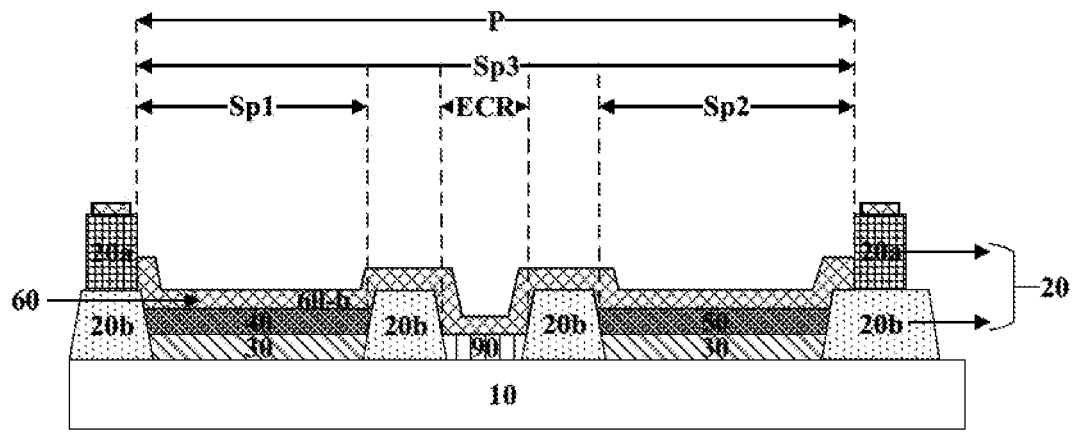

Referring to FIG. 7D, the method in some embodiments further includes forming a second electrode 60 on a side of the first organic light emitting layer 40 and the second organic light emitting layer 50 distal to the first electrode 30. The first electrode 30 and the second electrode 60 are formed to be configured to drive light emission of the first organic light emitting layer 40 in the first subpixel Sp1 and light emission of the second organic light emitting layer 50 in the second subpixel Sp2. The step of forming the second electrode 60 includes forming a plurality of second electrode blocks 60b respectively in a plurality of pixels P. The plurality of second electrode blocks 60b in adjacent pixels of the plurality of pixels P are insulated and spaced apart from each other. In some embodiments, the second electrode 60 is formed using an open mask process. As discussed above, the third side of the first sub-layer 20a is formed to have a first slope angle with respect to the second side of the first sub-layer 20a that is sufficiently steep such that, when the electrode material of the second electrode 60 is deposited on the pixel definition layer 20 (e.g., in an open mask process), the deposited electrode material does not fully cover the third side, resulting in a break in the second electrode 60 at or around the first sub-layer 20a. Thus, the plurality of second electrode blocks 60b in adjacent pixels of the plurality of pixels P are insulated from each other by the first sub-layer 20a. Optionally, any one of the plurality of second electrode blocks 60b is formed to be a continuous layer within each of the plurality of pixels P.

Optionally, the second electrode 60 is formed so that an orthographic projection of the second electrode 60 on the base substrate 10 at least partially overlaps with an orthographic projection of the first electrode 30 on the base substrate 10. Optionally, the orthographic projection of the second electrode 60 on the base substrate 10 substantially covers the orthographic projection of the first electrode 30 on the base substrate 10. Optionally, the second electrode 60 is formed so that an orthographic projection of the second electrode 60 on the base substrate 10 at least partially overlaps with an orthographic projection of the first organic light emitting layer 40 on the base substrate 10 and at least partially overlaps with an orthographic projection of the second organic light emitting layer 50 on the base substrate 10. Optionally, the second electrode 60 is formed so that the orthographic projection of the second electrode 60 on the base substrate 10 substantially covers the orthographic projection of the first organic light emitting layer 40 on the base substrate 10 and the orthographic projection of the second organic light emitting layer 50 on the base substrate 10.

Optionally, the second electrode 60 is formed by a vapor deposition method. Optionally, the second electrode 60 is formed to have a thickness in a range of approximately 7 nm to approximately 20 nm. Optionally, the second electrode 60 is formed using a metallic material, e.g., magnesium, silver, ytterbium, and other metals and alloys.

In some embodiments, the method further includes forming a pixel driving circuit. The second electrode 60 is formed to be electrically connected to the pixel driving circuit through the electrode connecting region. Optionally, the second electrode 60 is formed to be directly electrically connected to the pixel driving circuit, e.g., to a drain electrode of a driving thin film transistor in the pixel driving circuit. For example, each of the plurality of second electrode blocks 60b is formed to be directly electrically connected to the drain electrode without any intervening layer or component. Optionally, the second electrode 60 is electrically connected to a pixel driving circuit through the fourth electrode 90 in the electrode connecting region ECR. Optionally, the second electrode 60 and the fourth electrode 90 are in contact with each other and are connected with each other without any intervening layer or component. Optionally, the second electrode 60 and the fourth electrode 90 are formed so that an orthographic projection of the second electrode 60 on the base substrate 10 substantially covers an orthographic projection of the fourth electrode 90 on the base substrate 10. Optionally, the fourth electrode 90 is made of a metal oxide material; and the second electrode 60 is made of a metallic material.

The plurality of second electrode blocks 60b may be formed by any appropriate methods. In one example, the plurality of second electrode blocks 60b are formed by first depositing an electrode material layer on the base substrate 10, followed by patterning the electrode material layer to form the plurality of second electrode blocks 60b. In some embodiments, the plurality of second electrode blocks 60b are formed by depositing an electrode material layer on the base substrate 10 without further patterning. In one example, the pixel definition layer 20 includes a first sub-layer 20a in regions between adjacent pixels and absent in regions between adjacent subpixels in a same pixel. The first sub-layer 20a has a slope angle that is sufficiently steep such that the electrode material layer disconnects at the first sub-layer 20a due to the steep slope angle of the first sub-layer 20a.

Figure 7E:
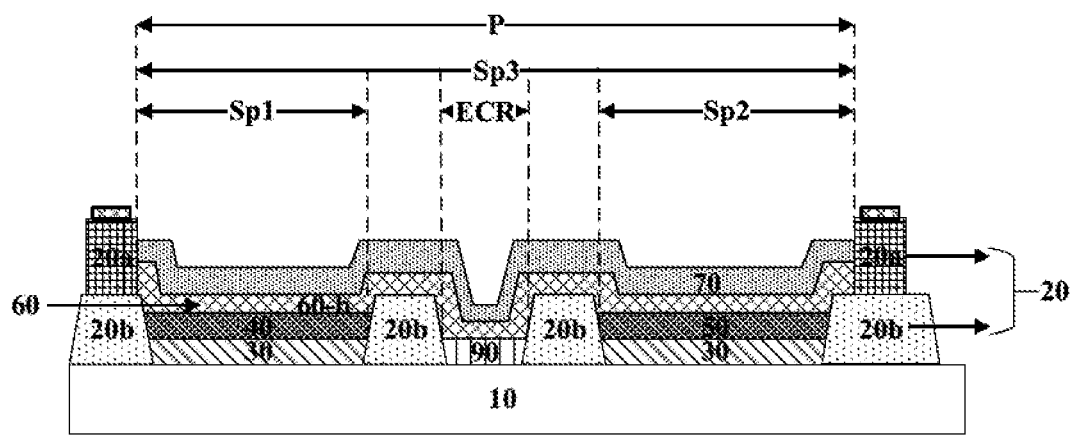

Referring to FIG. 7E, the method in sonic embodiments further includes forming a third organic light emitting layer 70 for emitting light of a third color on a side of the second electrode 60 distal to the base substrate 10. Optionally, the third organic light emitting layer 70 is formed so that an orthographic projection of the third organic light emitting layer 70 on the base substrate 10 at least partially overlaps with an orthographic projection of the first organic light emitting layer 40 on the base substrate 10 and at least partially overlaps with an orthographic projection of the second organic light emitting layer 50 on the base substrate 10. Optionally, the third organic light emitting layer 70 is formed so that the orthographic projection of the third organic light emitting layer 70 on the base substrate 10 substantially covers the orthographic projection of the first organic light emitting layer 40 on the base substrate 10 and the orthographic projection of the second organic light emitting layer 50 on the base substrate 10. Optionally, the third organic light emitting layer 70 is formed so that the orthographic projection of the third organic light emitting layer 70 on the base substrate 10 at least partially overlaps with an orthographic projection of the first electrode 30 on the base substrate 10. Optionally, the third organic light emitting layer 70 is formed so that the orthographic projection of the third organic light emitting layer 70 on the base substrate 10 substantially covers the orthographic projection of the first electrode 30 on the base substrate 10.

The third organic light emitting layer 70 may be formed by any appropriate method. Optionally, the third organic light emitting layer 70 is formed in the third subpixel Sp3 by depositing a third light emitting material, e.g., using a vapor deposition method. In the present method, the third organic light emitting layer 70 is formed as a continuous layer extending substantially throughout the entire pixel P. Accordingly, the organic light emitting diode display panel fabricated by the present method has a much greater aperture ratio as compared to the conventional display panel. Optionally, a light emitting material may have much higher performance when deposited by vapor deposition as compared to when deposited by printing or coating, and the light emitting material may be selected for forming the third organic light emitting layer 70. In one example, the third organic light emitting layer 70 includes a blue light emitting material, because the blue light emitting material has much higher performance when deposited by vapor deposition as compared to when deposited by printing or coating. As a result, the organic light emitting diode display panel can have a higher display quality and a longer life time.

In some embodiments, the third organic light emitting layer 70 is formed using an open mask process. As discussed above, the third side of the first sub-layer 20a is formed to have a first slope angle with respect to the second side of the first sub-layer 20a that is sufficiently steep such that, when the organic light emitting material of the third organic light emitting layer 70 is deposited on the pixel definition layer 20 (e.g., in an open mask process), the deposited organic light emitting material does not fully cover the third side, resulting in a break in the third organic light emitting layer 70 at or around the first sub-layer 20a. Thus, the plurality of third organic light emitting blocks in adjacent pixels of the plurality of pixels P are insulated from each other by the first sub-layer 20a. Optionally, any one of the plurality of third organic light emitting blocks is formed to be a continuous layer within each of the plurality of pixels P.

Figure 7F:
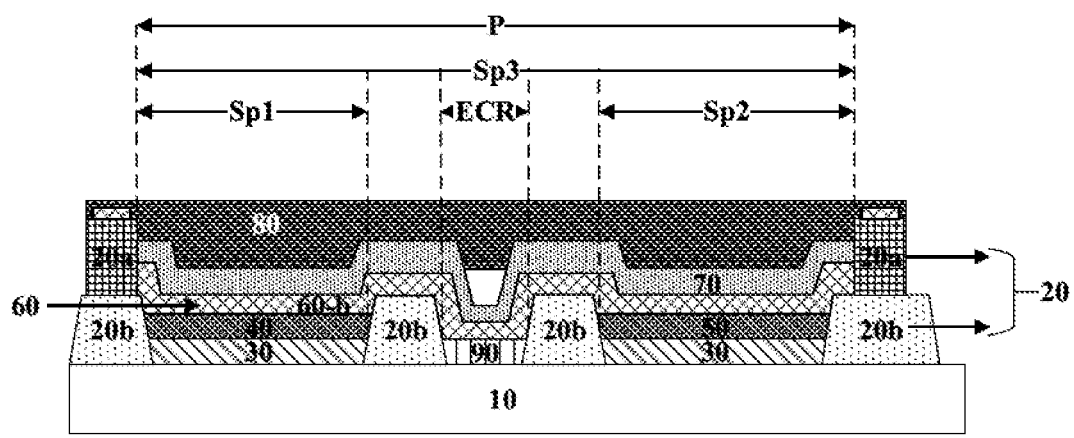

Referring to FIG. 7F, the method in some embodiments further includes forming a third electrode 80 on a side of the third organic light emitting layer 70 distal to the base substrate 10, the second electrode 60 and the third electrode 80 are formed to be configured to drive light emission of the third organic light emitting layer 70. Accordingly, forming the organic light emitting diode display panel includes forming at least a first organic light emitting diode in the first subpixel Sp1, a second organic light emitting diode in the second subpixel Sp2, and a third organic light emitting diode in the third subpixel Sp3. The first organic light emitting diode in the first subpixel Sp1 is formed by at least the first electrode 30, the first organic light emitting layer 40, and the second electrode 60. The second organic light emitting diode in the second subpixel Sp2 is formed by at least the first electrode 30, the second organic light emitting layer 50, and the second electrode 60. The third organic light emitting diode in the third subpixel Sp3 is formed by at least the second electrode 60, the third organic light emitting layer 70, and the third electrode 80. Optionally, the step of forming the third electrode includes forming an integral electrode layer on side of the third organic light emitting layer 70 distal to the base substrate 10 without any subsequent patterning steps.

In some embodiments, the method further includes forming a pixel driving circuit. Optionally, the step of forming the pixel driving circuit includes forming a first switch thin film transistor and forming a first driving thin film transistor fur controlling light emission in the first subpixel, thrilling a second switch thin film transistor and forming a second driving thin film transistor for controlling light emission in the second subpixel, and forming a third switch thin film transistor and forming a third driving thin film transistor for controlling light emission in the third subpixel. The pixel driving circuit is formed so that a drain electrode of the first driving thin film transistor is electrically connected to the first electrode; a drain electrode of the second driving thin film transistor is electrically connected to the first electrode; and a drain electrode of the third driving thin film transistor is electrically connected to the second electrode.

Optionally, the organic light emitting diode display panel is a top emission-type organic light emitting diode display panel. Optionally, the organic light emitting diode display panel is a bottom emission-type organic light emitting diode display panel. Optionally, the organic light emitting diode display panel is a dual emission-type organic light emitting diode display panel.

Various appropriate electrode materials and various appropriate fabricating methods may be used to make the first electrode 30, the second electrode 60, the third electrode 80, and the fourth electrode 90, For example, an electrode material may be deposited on the substrate, e.g., by sputtering or vapor deposition or solution coating; and patterned. Examples of appropriate electrode materials for making the first electrode 30, the second electrode 60, the third electrode 80, or the fourth electrode 90 include, but are not limited to, metal oxide (e.g., indium tin oxide), aluminum, molybdenum, silver, ytterbium, aluminum Neodymium (AlNd), copper, molybdenum Niobium (MoNb), alloys and laminates thereof (e.g., a molybdenum-aluminum-molybdenum laminated structure).

The second electrode 60 is a substantially transparent electrode. Optionally, the second electrode 60 is substantially transparent metallic thin layer. Optionally, the second electrode 60 is made of one or a combination of magnesium, silver, and ytterbium.

Optionally, the first electrode 30 is a reflective electrode when the organic light emitting diode display panel is a top emission-type display panel.

Optionally, the fourth electrode 90 is made of a transparent metal oxide, e.g., indium tin oxide.

In another aspect, the present disclosure provides an organic light emitting diode display apparatus having an organic light emitting diode display panel described herein or fabricated by a method described herein. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention, it should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An organic light emitting diode display panel, comprising:
   a base substrate;
   a pixel definition layer on the base substrate for defining a pixel comprising at least a first subpixel, a second subpixel, and a third subpixel, the pixel definition layer comprising a first portion and a second portion;
   a groove between the first portion and the second portion of the pixel definition layer;

a first electrode on the base substrate and in the first subpixel and the second subpixel;

a first organic light emitting layer for emitting light of a first color in the first subpixel, the first organic light emitting layer on a side of the first electrode distal to the base substrate;

a second organic light emitting layer for emitting light of a second color in the second subpixel, the second organic light emitting layer on a side of the first electrode distal to the base substrate;

a second electrode on a side of the first organic light emitting layer and the second organic light emitting layer distal to the first electrode, the first electrode and the second electrode configured to drive light emission of the first organic light emitting layer in the first subpixel and light emission of the second organic light emitting layer in the second subpixel;

a third organic light emitting layer for emitting light of a third color on a side of the second electrode distal to the base substrate;

a third electrode on a side of the third organic light emitting layer distal to the base substrate, the second electrode and the third electrode configured to drive light emission of the third organic light emitting layer;

a pixel driving circuit in the pixel; and a fourth electrode in a region between the first subpixel and the second subpixel and inside the groove, electrically connecting the second electrode to a drain electrode of a driving transistor of the pixel driving circuit;

wherein an orthographic projection of the third organic light emitting layer on the base substrate at least partially overlaps with an orthographic projection of the first organic light emitting layer on the base substrate and at least partially overlaps with an orthographic projection of the second organic light emitting layer on the base substrate;

wherein the first portion of the pixel definition layer spaces apart from the second portion of the pixel definition layer and directly contacts the first organic light emitting layer;

wherein the second portion of the pixel definition layer directly contacts the second organic light emitting layer; and wherein an orthographic projection of the fourth electrode does not overlap with the orthographic projection of the first organic light emitting layer and the orthographic projection of the second organic light emitting layer.

2. The organic light emitting diode display panel of claim 1, wherein
the orthographic projection of the first subpixel on the base substrate and the orthographic projection of the second subpixel on the base substrate are substantially non-overlapping with each other.

3. The organic light emitting diode display panel of claim 1, wherein an orthographic projection of the second electrode on the base substrate at least partially overlaps with an orthographic projection of the first electrode on the base substrate.

4. The organic light emitting diode display panel of claim 3, wherein the orthographic projection of the second electrode on the base substrate substantially covers the orthographic projection of the first electrode on the base substrate.

5. The organic light emitting diode display panel of claim 1, wherein
the orthographic projection of the first organic light emitting layer on the base substrate and the orthographic projection of the second organic light emitting layer on the base substrate are substantially non-overlapping with each other.

6. The organic light emitting diode display panel of claim 5, wherein the orthographic projection of the third organic light emitting layer on the base substrate substantially covers the orthographic projection of the first organic light emitting layer on the base substrate and the orthographic projection of the second organic light emitting layer on the base substrate.

7. The organic light emitting diode display panel of claim 1, wherein the second electrode comprises a plurality of second electrode blocks respectively in a plurality of pixels;
the plurality of second electrode blocks in adjacent pixels of the plurality of pixels are insulated from each other.

8. The organic light emitting diode display panel of claim 7, wherein the pixel definition layer comprises a first sub-layer in regions between adjacent pixels and absent in regions between adjacent subpixels of different colors in a same pixel;
the first sub-layer has a first side and a second side substantially opposite to each other and a third side connecting the first side and the second side, the first side on a side of the second side distal to the base substrate;
the third side of the first sub-layer has a first slope angle with respect to the second side of the first sub-layer greater than approximately 60 degrees; and
the plurality of second electrode blocks in adjacent pixels of the plurality of pixels are insulated from each other by the first sub-layer.

9. The organic light emitting diode display panel of claim 8, wherein the first sub-layer has a thickness in a range of approximately 20 nm to approximately 500 nm.

10. The organic light emitting diode display panel of claim 8, wherein the pixel definition layer further comprises a second sub-layer in regions between adjacent subpixels;
the second sub-layer is on a side of the first sub-layer proximal to the base substrate;
the second sub-layer has a fourth side and a fifth side substantially opposite to each other and a sixth side connecting the fourth side and the fifth side, the fourth side on a side of the fifth side distal to the base substrate;
the sixth side of the second sub-layer has a second slope angle with respect to the fifth side of the second sub-layer; and
the second slope angle is smaller than the first slope angle.

11. The organic light emitting diode display panel of claim 10, wherein the second slope angle is in a range of approximately 20 degrees to approximately 40 degrees.

12. The organic light emitting diode display panel of claim 1
wherein
an orthographic projection of the second electrode on the base substrate covers an orthographic projection of the fourth electrode on the base substrate.

13. The organic light emitting diode display panel of claim 1, wherein the fourth electrode is made of a metal oxide material; and
the second electrode is made of a metallic material.

14. The organic light emitting diode display panel of claim 1,;
wherein the pixel driving circuit comprises a first switch thin film transistor and a first driving thin film transistor for controlling light emission in the first subpixel, a second switch thin film transistor and a second driving thin film transistor for controlling light emission in the second subpixel, and a third switch thin film transistor and a third driving thin film transistor for controlling light emission in the third subpixel;

a drain electrode of the first driving thin film transistor is electrically connected to the first electrode;

a drain electrode of the second driving thin film transistor is electrically connected to the first electrode; and a drain electrode of the third driving thin film transistor is electrically connected to the second electrode.

15. The organic light emitting diode display panel of claim 1, wherein the third organic light emitting layer is a blue light emitting layer for emitting a blue light.

16. The organic light emitting diode display panel of claim 1, wherein the first electrode is a reflective electrode, the second electrode and the third electrode are substantially transparent electrodes.

17. An organic light emitting diode display apparatus, comprising the organic light emitting diode display panel of claim 1.

18. A method of driving an organic light emitting diode display panel, wherein the organic light emitting diode display panel comprises:
a base substrate;
a pixel definition layer on the base substrate for defining a pixel comprising at least a first subpixel, a second subpixel, and a third subpixel, the pixel definition layer comprising a first portion and a second portion;
a groove between the first portion and the second portion of the pixel definition layer;
a first electrode on the base substrate and in the first subpixel and the second subpixel;
a first organic light emitting layer for emitting light of a first color in the first subpixel, the first organic light emitting layer on a side of the first electrode distal to the base substrate;
a second organic light emitting layer for emitting light of a second color in the second subpixel, the second organic light emitting layer on a side of the first electrode distal to the base substrate;
a second electrode on a side of the first organic light emitting layer and the second organic light emitting layer distal to the first electrode, the first electrode and the second electrode configured to drive light emission of the first organic light emitting layer in the first subpixel and light emission of the second organic light emitting layer in the second subpixel;
a third organic light emitting layer for emitting light of a third color on a side of the second electrode distal to the base substrate;
a third electrode on a side of the third organic light emitting layer distal to the base substrate, the second electrode and the third electrode configured to drive light emission of the third organic light emitting layer;
a pixel driving circuit;
a fourth electrode in a region between the first subpixel and the second subpixel and inside the groove, electrically connecting the second electrode to a drain electrode of a driving transistor of the pixel driving circuit;
wherein an orthographic projection of the third organic light emitting layer on the base substrate at least partially overlaps with an orthographic projection of the first organic light emitting layer on the base substrate and at least partially overlaps with an orthographic projection of the second organic light emitting layer on the base substrate;

wherein the first portion of the pixel definition layer spaces apart from the second portion of the pixel definition layer and directly contacts the first organic light emitting layer;

wherein the second portion of the pixel definition layer directly contacts the second organic light emitting layer;

wherein an orthographic projection of the fourth electrode does not overlap with the orthographic projection of the first organic light emitting layer and the orthographic projection of the second organic light emitting layer; and wherein the pixel driving circuit comprises:
a first switch thin film transistor and a first driving thin film transistor for controlling light emission in the first subpixel, a second switch thin film transistor and a second driving thin film transistor for controlling light emission in the second subpixel, and a third switch thin film transistor and a third driving thin film transistor for controlling light emission in the third subpixel;
a drain electrode of the first driving thin film transistor is electrically connected to the first electrode;
a drain electrode of the second driving thin film transistor is electrically connected to the first electrode;
a drain electrode of the third driving thin film transistor is electrically connected to the second electrode;

the method comprises driving the organic light emitting diode display panel in a time-division driving mode comprising a first light emission mode and a second light emission mode:
wherein in the first light emission mode, turning on the first switch thin film transistor, the second switch thin film transistor, and the third switch thin film transistor, providing a first high voltage signal to a source electrode of the first driving thin film transistor, providing a second high voltage signal to a source electrode of the second driving thin film transistor, and providing a low voltage signal to a source electrode of the third driving thin film transistor; and
in the second light emission mode, turning off the first switch thin film transistor and the second switch thin film transistor, turning on the third switch thin film transistor, providing a third high voltage signal to a source electrode of the third driving thin film transistor;
wherein the first subpixel and the second subpixel are driven to emit light in the first light emission mode and substantially not emit light in the second light emission mode; and
the third subpixel is driven to emit light in the second light emission mode and substantially not emit light in the first light emission mode.

19. A method of fabricating an organic light emitting diode display panel, comprising:
forming a pixel definition layer on a base substrate for defining a pixel comprising at least a first subpixel, a second subpixel, and a third subpixel, the pixel definition layer comprising a first portion and a second portion;
a groove between the first portion and the second portion of the pixel definition layer;
forming a first electrode on the base substrate and in the first subpixel and the second subpixel;

forming a first organic light emitting layer for emitting light of a first color in the first subpixel, the first organic light emitting layer on a side of the first electrode distal to the base substrate;

forming a second organic light emitting layer for emitting light of a second color in the second subpixel, the second organic light emitting layer on a side of the first electrode distal to the base substrate;

forming a second electrode on a side of the first organic light emitting layer and the second organic light emitting layer distal to the first electrode, the first electrode and the second electrode configured to drive light emission of the first organic light emitting layer in the first subpixel and light emission of the second organic light emitting layer in the second subpixel;

forming a third organic light emitting layer for emitting light of a third color on a side of the second electrode distal to the base substrate;

forming a third electrode on a side of the third organic light emitting layer distal to the base substrate, the second electrode and the third electrode configured to drive light emission of the third organic light emitting layer; and forming a fourth electrode in a region between the first subpixel and the second subpixel and inside the groove, electrically connecting the second electrode to a drain electrode of a driving transistor of a pixel driving circuit;

wherein an orthographic projection of the third organic light emitting layer on the base substrate at least partially overlaps with an orthographic projection of the first organic light emitting layer on the base substrate and at least partially overlaps with an orthographic projection of the second organic light emitting layer on the base substrate;

wherein the first portion of the pixel definition layer spaces apart from the second portion of the pixel definition layer and directly contacts the first organic light emitting layer;

wherein the second portion of the pixel definition layer directly contacts the second organic light emitting layer; and wherein an orthographic projection of the fourth electrode does not overlap with the orthographic projection of the first organic light emitting layer and the orthographic projection of the second organic light emitting layer.

* * * * *